United States Patent
Jennings et al.

(10) Patent No.: US 6,803,297 B2
(45) Date of Patent: Oct. 12, 2004

(54) OPTIMAL SPIKE ANNEAL AMBIENT

(75) Inventors: Dean Jennings, Beverly, MA (US); Sairaju Tallavarjula, Santa Clara, CA (US); Randhir Thakur, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 158 days.

(21) Appl. No.: 10/251,440

(22) Filed: Sep. 20, 2002

(65) Prior Publication Data

US 2004/0058512 A1 Mar. 25, 2004

(51) Int. Cl.$^7$ .............................................. H01L 21/425
(52) U.S. Cl. ...................................... 438/530; 438/795
(58) Field of Search ................................ 438/308, 514, 438/515, 763, 778, 795, 909, 920

(56) References Cited

U.S. PATENT DOCUMENTS

| | | |
|---|---|---|
| 6,087,247 A | 7/2000 | Downey |
| 6,100,149 A | 8/2000 | Nenyei et al. |
| 2001/0031544 A1 * | 10/2001 | Matsuda ...................... 438/530 |
| 2003/0186554 A1 * | 10/2003 | Tam et al. .................. 438/716 |
| 2004/0058560 A1 * | 3/2004 | Ranish et al. ............... 438/795 |

OTHER PUBLICATIONS

Heide et al., Proceeding of Ion Implantation Technology Conference, 2000, pp. 678–681, Conference Editors: H. Ryssel, L. Frey, J. Gyulai, H. Glawisching.

* cited by examiner

Primary Examiner—Kamand Cuneo
Assistant Examiner—Lisa Kilday
(74) Attorney, Agent, or Firm—Charles S. Guenzer, Esq.

(57) ABSTRACT

A method for activating implanted dopants in a semiconductor substrate to form shallow junctions comprises the steps of: maintaining gas pressure in the processing chamber at a level significantly lower than atmospheric pressure, providing a flow of a carrier gas into the processing chamber, subjecting the substrate to a temperature treatment process, and introducing oxygen into the processing chamber during all or part of the temperature treatment process.

20 Claims, 4 Drawing Sheets

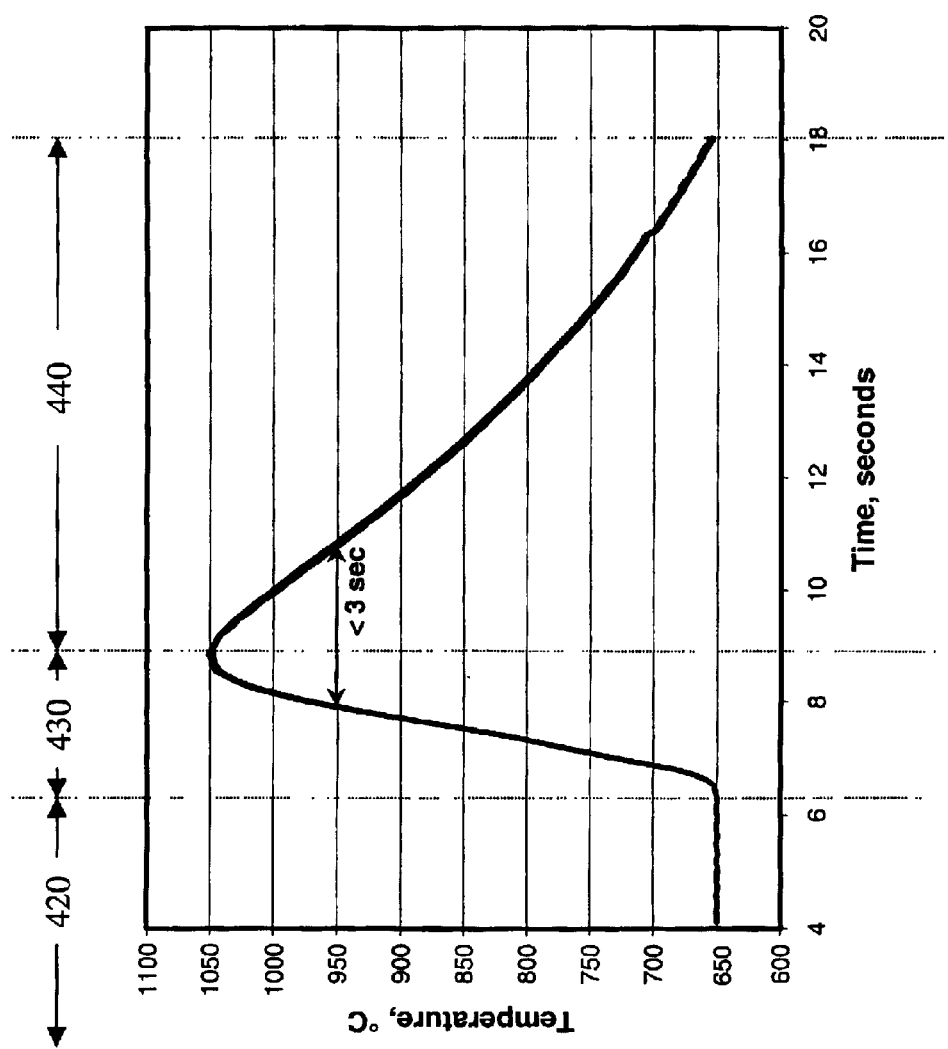
FIG._4

OPTIMAL SPIKE ANNEAL AMBIENT

The present application relates to semiconductor processing technologies, and particularly to a method of annealing semiconductor wafers with rapid thermal processing.

BACKGROUND OF THE INVENTION

In today's high speed semiconductor devices, ultra-shallow junctions, low sheet resistance and abrupt lateral junctions are vital to reduce short channel effects and to increase transistor saturation current in source drain extensions. Several techniques have been developed to deal with the issues associated with the formation of shallow, low sheet resistance junctions. Examples of these issues are transient enhanced diffusion (TED), solid solubility, and channeling, which can be resolved by using low energy implants and sharp spike anneals. During low energy implant processes, the implant energies are limited to about 1 keV or less. Thus, TED is minimized because defects caused by the implant processes are confined close to the surface. Sharp spike anneals following the implant processes provide high dopant activation and effective implant damage removal while minimizing dopant diffusion.

Spike anneal is typically performed by subjecting a semiconductor wafer or substrate having implanted dopants to temperature treatment in a rapid thermal processing (RTP) system. A typical annealing profile using RTP involves ramping up to a target temperature, e.g. 1050° C., soaking the wafer at the target temperature for a period of time (soak time), and ramping down to a base temperature, e.g. 200° C. For spike anneal, high ramp rates, e.g., 75° C./sec or higher, and short (~1 sec) or no soak time are desired to prevent excessive dopant diffusion. Besides the tight temperature control requirement, gas composition in the annealing ambient may also need to be controlled. For example, the presence of oxygen has been found to be necessary in order to decrease the evaporation or out-diffusion of implanted dopants such as boron and arsenic, but too much oxygen in the annealing ambient results in oxygen enhanced diffusion (OED). OED has been found to be a limiting factor for the creation of shallow junctions, particularly when dopants such as boron are used.

Conventional spike anneal processes are typically performed at an ambient gas pressure that is comparable to atmospheric pressure. The oxygen concentration in these processes can not be accurately and dynamically controlled, due partly to the long response time for the oxygen concentration to adjust to a desired concentration level in these processes. At around atmospheric pressure, this response time may be comparable with the time a spike anneal process typically takes. For example, in a spike anneal process disclosed in U.S. Pat. No. 6,087,247, oxygen concentration has to be adjusted and stabilized before thermal processing of each wafer by first purging the RTP chamber with a process gas until the oxygen concentration in the chamber is below a threshold, and then introducing oxygen into the chamber at a controlled level. At atmospheric pressure, this process of obtaining desired oxygen concentration in an RTP chamber before thermal processing of each wafer is time consuming and can become a wafer fabrication bottleneck.

SUMMARY OF THE INVENTION

The present invention includes a process of annealing semiconductor substrates with rapid thermal processing, in which gas pressure and gas composition in an annealing ambient is actively and dynamically controlled during thermal processing of the semiconductor substrates. In one embodiment of the present invention, a method for activating implanted dopants in a semiconductor substrate to form shallow junctions comprises placing the substrate in a thermal processing chamber and subjecting the substrate to a temperature treatment process (or thermal process) which includes a plurality of temperature ramp phases. The chamber pressure is maintained at a level lower than about 300 Torr by a closed-loop pressure control system, and a pump system is used to accelerate gas exchanges in the chamber. A transfer chamber is provided so that substrates can be transferred in and out of the processing chamber without increasing the chamber pressure and substantially changing the gas composition in the chamber. Oxygen is introduced during all or part of the thermal process, such as a fast-ramp phase of the thermal process in which substrate temperature is ramped up rapidly to a peak temperature. A volumetric flow rate at which oxygen is introduced into the processing chamber is selected such that the oxygen concentration in the processing chamber reaches a level within a range of 1500–75000 ppm before the substrate reaches the peak temperature. The volumetric flow rate of oxygen may be controlled by a closed-loop fluid control system that adjusts the volumetric flow rate of oxygen according to an oxygen concentration set point. The low gas pressure in the annealing ambient provides much faster response time in adjusting gas compositions in the annealing ambient and allows dynamic control of the gas compositions in the annealing ambient during thermal processing of the semiconductor substrates.

BRIEF DESCRIPTION OF THE DRAWINGS

Additional objects and features of the invention will be more readily apparent from the following detailed description and appended claims when taken in conjunction with the drawings, in which:

FIG. 4 is a chart of a heating schedule according to one embodiment of the present invention.

DETAILED DESCRIPTION OF THE INVENTION

Figure 1:
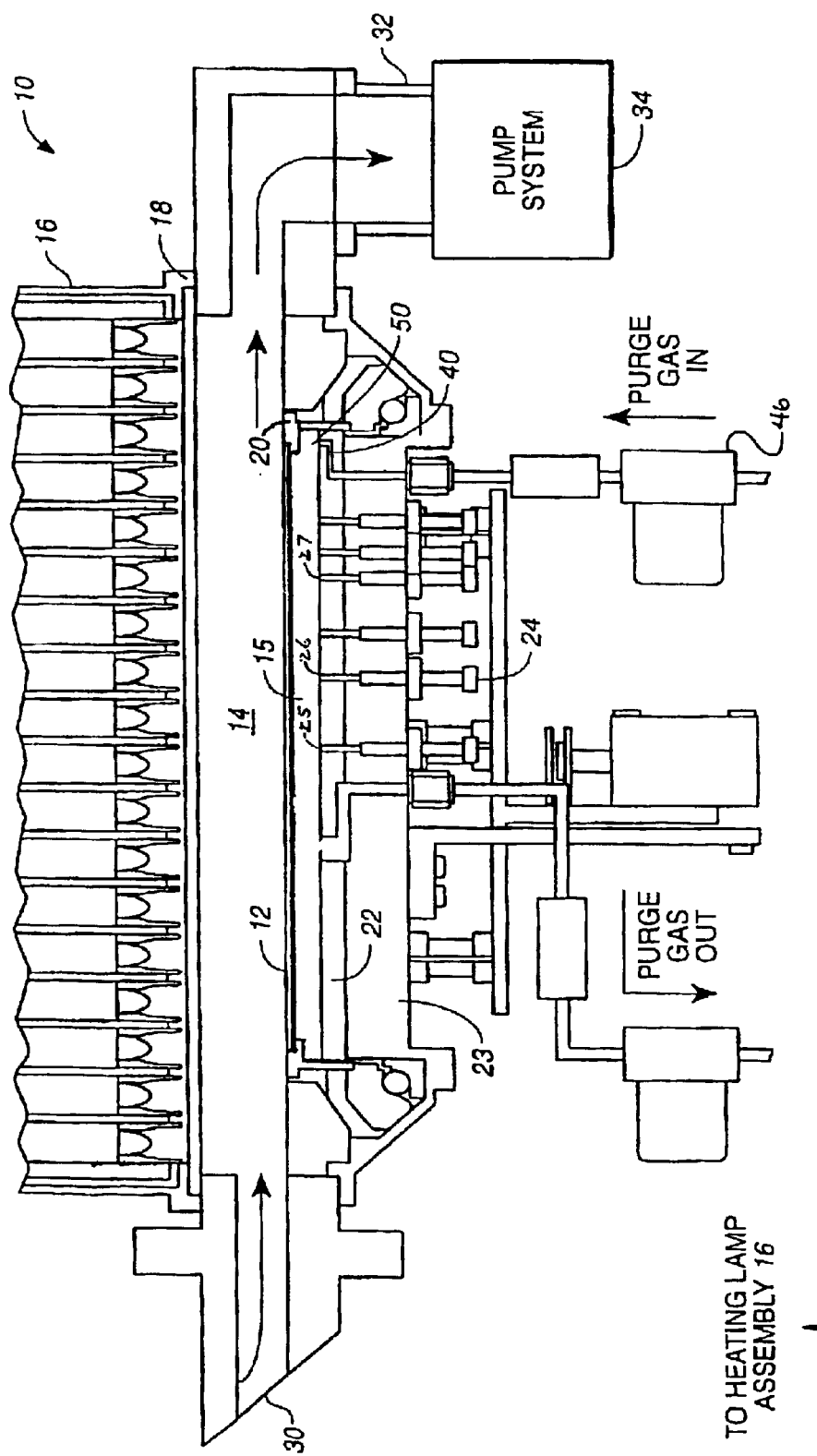
FIG. 1 is a diagrammatic view in vertical cross-section of a portion of an RTP system according to one embodiment of the present invention.

The method of the present invention can be performed in an RTP system capable of maintaining gas pressure in the annealing ambient at a level significantly lower than the atmospheric pressure. An example of such an RTP system is the RADIANCE CENTURA® SYSTEM commercially available from Applied Materials, Inc., in Santa Clara, Calif. FIG. 1 illustrates a rapid thermal processing (RTP) system 10 including a processing chamber 14 for annealing a disk-shaped semiconductor substrate 12, according to one embodiment of the present invention. Chamber 14 is radiatively heated through a water-cooled quartz window 18 by a heating lamp assembly 16. The peripheral edge of substrate 12 is supported by a rotatable support structure 20, which can rotate at a rate of up to about 120 rpm (revolutions per minute). Beneath substrate 12 is a nickel-plated aluminum reflector plate assembly 22 that has an optically reflective surface facing the backside of substrate 12 to enhance the effective emissivity of substrate 12. Reflector plate assembly 22 is mounted on a water-cooled base 23, which is typically maintained at about room temperature, e.g., 23° C. Between the top surface of reflector plate assembly 22 and the backside of substrate 12 is a reflective cavity 15.

In a system designed for processing eight inch (200 mm) silicon wafers, reflector 22 has a diameter of about 8.9 inches, the separation between substrate 12 and the top surface of reflector 22 is about 5–10 mm, and the separation between substrate 12 and the bottom surface of quartz window assembly 18 is about 25 mm. In a system designed for processing twelve-inch (300 mm) silicon wafers, reflector 22 has a diameter of about 13 inches, the separation between substrate 12 and the top surface of reflector 22 is about 18 mm, and the separation between substrate 12 and the bottom surface of quartz window assembly 18 is about 30 mm.

The temperatures at localized regions of substrate 12 are measured by a plurality of temperature probes 24 that are positioned to measure substrate temperature at different radial locations across the substrate. Temperature probes 24 receive light from inside the processing chamber through optical ports 25,26, and 27, which extend through the top surface of reflector plate assembly 22. While processing system 10 typically may have a total of ten such temperature probes, only some of the probes are shown in FIG. 1. At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 12. Temperature measurements from the optical detectors are received by a first controller 28 that controls the radiative output of heating lamp assembly 16. The resulting feedback loop improves the ability of the processing system to uniformly heat substrate 12.

During processing, gases for the annealing ambient are introduced into processing chamber 14 through an ambient gas input 30. The ambient gases flow across the top surface of substrate 12 and may react with a heated substrate. Excess ambient gases, as well as any reaction by-products, are withdrawn from processing chamber 14 through an ambient gas output 32 by a pump system 34.

Most of the excess ambient gases and reaction products can be pumped out of processing chamber 14, but some volatile contaminants, especially those with relatively high vapor pressures such as $BO_x$ and $PO_x$, may leak into reflective cavity 15 and deposit onto the optical components situated around the reflective cavity. The rate at which volatile contaminants are deposited onto these optical components can be substantially reduced by a flow of a purge gas across the top surface of reflective plate assembly 22. As described in commonly assigned U.S. Pat. No. 6,281,790 B1, which is incorporated herein by reference, a purge fluid injector 40 can be used to produce a substantially laminar flow of a purge gas across the top surface of reflector plate assembly 22.

Figure 2:
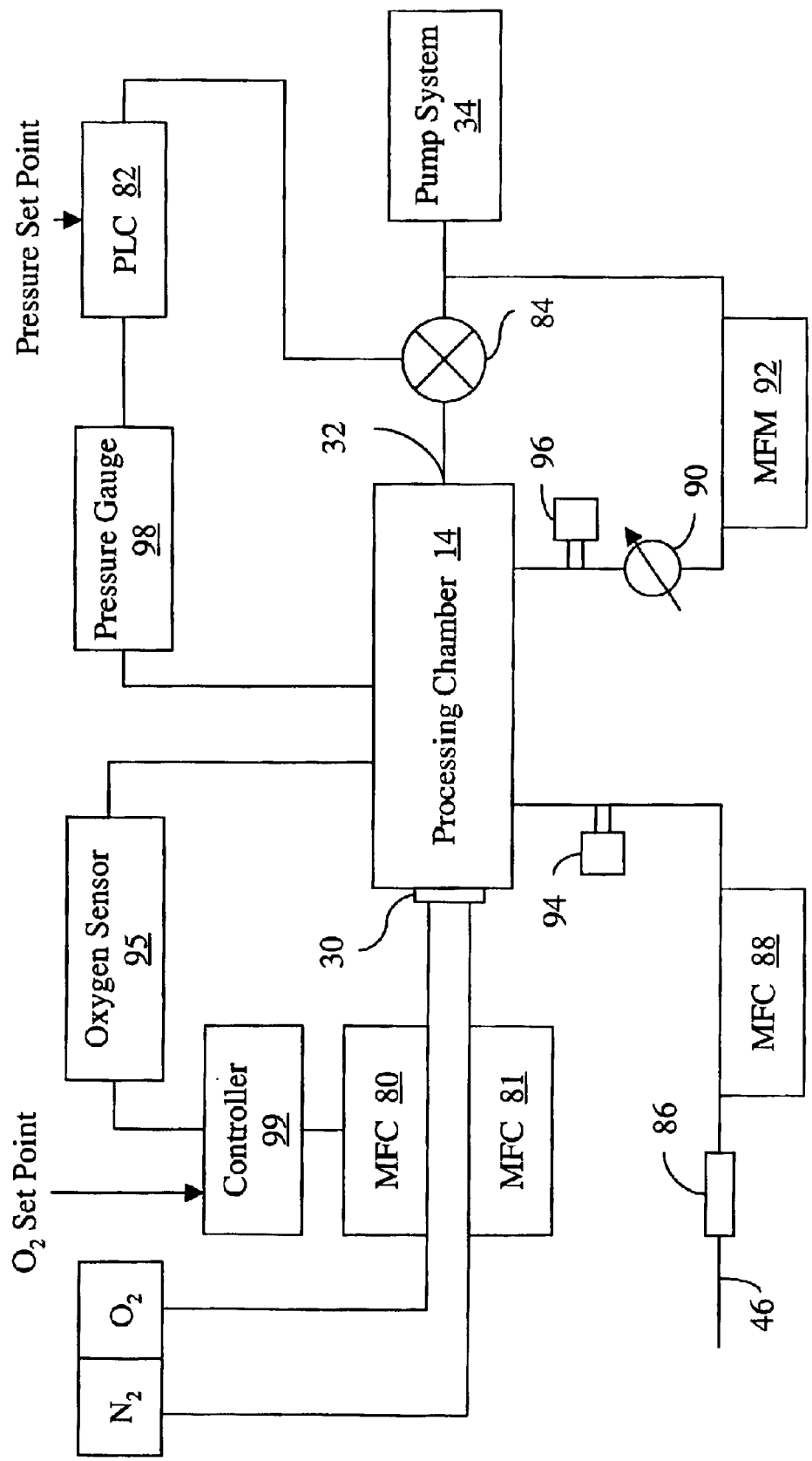
FIG. 2 is a block diagram of a fluid control system that dynamically monitors and controls gas composition and gas pressure in a processing chamber of the RTP system.

The composition of the ambient gases, the flow rate of the purge gas, and the gas pressure in processing chamber 14 are controlled by a fluid control system shown in FIG. 2. In one embodiment of the present invention, the ambient gases comprise oxygen ($O_2$) and a carrier gas, such as nitrogen ($N_2$). Mass flow controllers (MFC) 81 and 80 are used to regulate the flow of the carrier gas and oxygen, respectively, into processing chamber 14. A second feedback loop associated with processing chamber 14 controls the oxygen concentration in processing chamber. The second feedback loop includes the MFC 80, an oxygen sensor 95 coupled to the processing chamber 14 and configured to monitor the oxygen concentration in processing chamber, and a second controller 99 coupled between the oxygen sensor 95 and MFC 80, and configured to adjust the MFC based on an oxygen concentration set point ($O_2$ set point) and the oxygen concentration value detected by the oxygen sensor 95. The second feedback loop insures that a desired $O_2$ concentration is maintained in processing chamber 14, and may be used as part of a shut down mechanism associated with chamber 14 to prevent substrates from being processed in chamber 14 when the oxygen concentration cannot be regulated properly.

In one embodiment of the present invention, experiments are performed to measure the $O_2$ concentration in process chamber 14 with different flow rates of the carrier gas and oxygen, and at different gas pressure in processing chamber 14. Then, given the actual flow rate of the carrier gas, the gas pressure, and the desired oxygen concentration, a pre-calibrated oxygen flow rate can be determined from the experimental data by a method such as curve fitting. The pre-calibrated oxygen flow rate can be used to reduce the time taken by the second feedback loop to arrive at a desired $O_2$ concentration level.

When a purge gas, such as nitrogen, is used to prevent deposition of volatile contaminants in the reflective cavity 15, the purge gas is introduced into processing chamber 14 through input 46 which is connected to a filter 86. An MFC 88 is used to regulate the flow of purge gas into processing chamber 14. An adjustable flow restrictor 90 and a mass flow meter (MFM) 92 are used to regulate the rate at which purge gas is removed from processing chamber 14. To reduce the migration of purge gas into the processing region of the processing chamber 14, which is above substrate 12, flow restrictor 90 is adjusted such that the rate at which purge gas is introduced into processing chamber 14 is substantially the same as the rate at which purge gas is removed from processing chamber 14. Solenoid shut-off valves 94 and 96 provide additional control over the flow of purge gas through processing chamber 14.

A third feedback loop associated with chamber 14 is a closed-loop pressure control system used to regulate the gas pressure in processing chamber 14 by controlling the rate at which gases are removed from processing chamber 14. Still referring to FIG. 2, in one embodiment of the present invention, the pressure control system comprises a pressure control valve 84 at ambient gas output 32, a pressure gauge 98 coupled to processing chamber 14, a programmable logic controller (PLC) 82 coupled to pressure gauge 98, and a third controller 97 coupled between PLC 82 and pressure control valve 84. During the operation of the processing chamber 14, the pressure gauge 98 measures the gas pressure in processing chamber 14 periodically and sends the measured pressure value to PLC 82. PLC 82 subtracts the measured pressure value from a pressure set point, which indicates the intended gas pressure in chamber 14, and uses an algorithm, such as a proportional integral derivative (PID) control algorithm, to produce a control signal based on a set of tuning parameters. The control signal is then used by PLC 82 to adjust the amount of flow through pressure control valve 84.

In one embodiment of the present invention, processing chamber 14 is coupled to one or more transfer chambers (not shown), each through a load lock (not shown). The transfer chamber(s) and the associated load lock system facilitate transfers of substrates in and out of processing chamber 14 without substantially changing the gas pressure in processing chamber 14.

Figure 3:
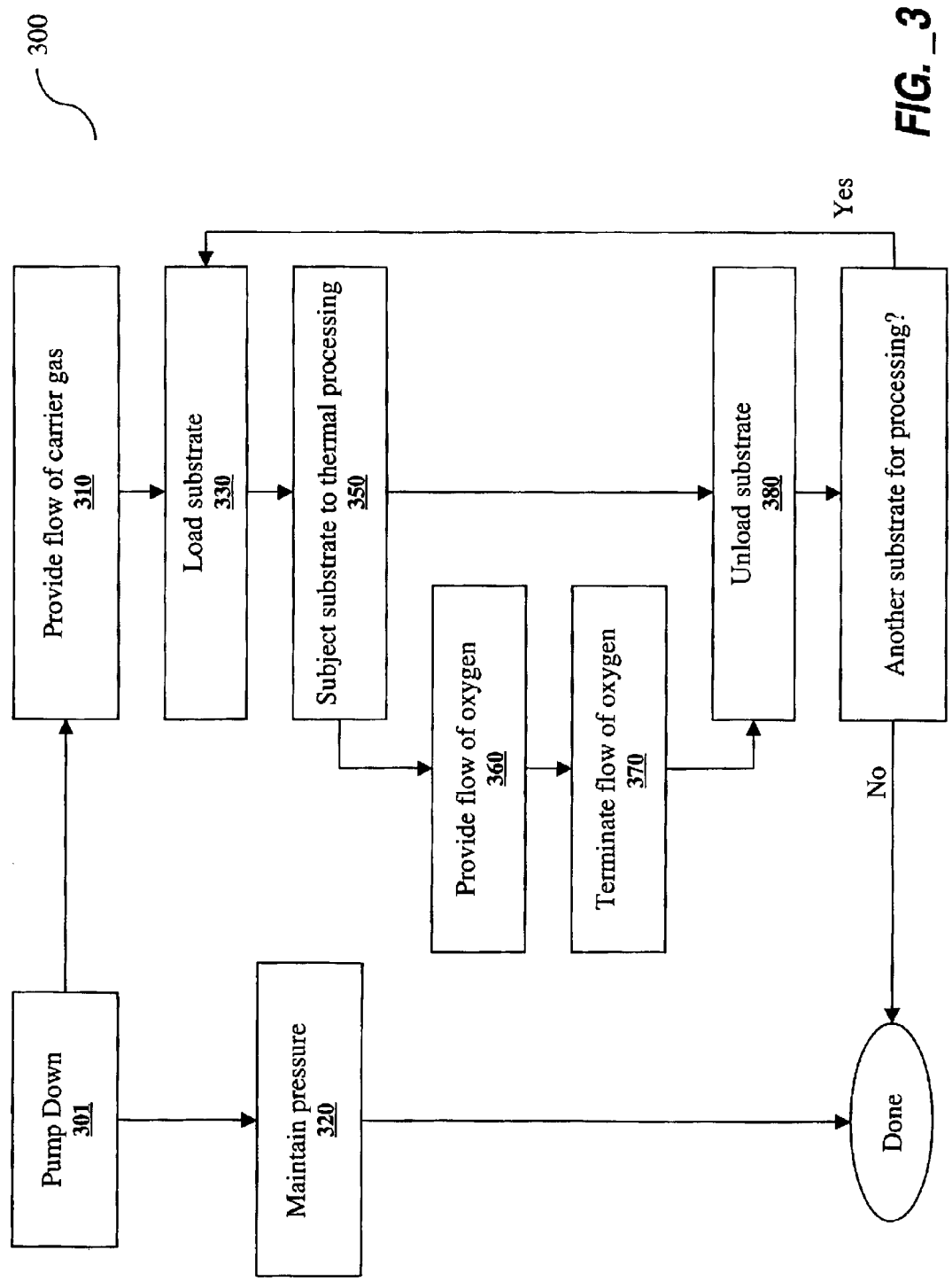
FIG. 3 is a flow diagram of a method for annealing a silicon substrate in the processing chamber of the RTP system.

A semiconductor substrate 12, after going through a dopant implant process, can be annealed in processing chamber 14 using a process 300, as illustrated in FIG. 3, according to one embodiment of the present invention. Referring to FIG. 3, before the substrate is loaded into the chamber, processing chamber 14 is pumped down at step 301 to a pressure level substantially lower than the atmospheric pressure. Then, while the gas pressure in processing chamber 14 is maintained at step 320 at the pressure level, processing chamber 14 is purged at step 310 with a carrier gas, such as nitrogen, which is introduced into chamber 14 through MFC 81. Other suitable carrier gases include argon, krypton, and xenon. In one embodiment of the present invention, the gas pressure in processing chamber 14 is maintained at step 320 at a level that is in the range of about 1–300 Torr, or more typically, in the range of about 5–100 Torr. The flow rate of the carrier gas during the purge step 310 is in the range of about 5–10 standard liter per minute (slm). The purging step reduces the oxygen concentration in processing chamber 14 to below a predetermined minimum value, such as 5 or 50 parts per million (ppm). The time the purging step 310 takes depends on the pressure in processing chamber 14. In one embodiment of the present invention, when the gas pressure in processing chamber 14 is maintained at 10 Torr, it takes less than a few seconds of purging for the oxygen concentration in processing chamber 14 to drop below 5 ppm. At 100 Torr, the purging step may take about 15 seconds, which is still about 4 times quicker than purging at atmospheric pressure, as in the conventional spike anneal process. Also, purging step 310 may not need to be performed for every substrate, as explained below.

Before or after the purging step 310, substrate 12 is loaded at step 330 into processing chamber 14 from the transfer chamber, which is maintained at near vacuum and is also purged of oxygen. If substrate 12 is loaded after the purging step, a stabilization step (not shown) may be needed to allow the chamber pressure to stabilize after the loading step 330. Once the chamber pressure is stabilized, while the carrier gas flow is maintained at a predetermined flow rate, such as 5 or 10 slm, the substrate is subjected to a thermal process at step 350. In one embodiment of the present invention, the thermal process step 350 comprises several phases including a slow-ramp phase, a stabilization phase, a fast-ramp phase, and a cool-down phase. FIG. 4 illustrates a heating schedule of the thermal process step 350 in one embodiment of the present invention, showing changes in substrate temperature during part of the stabilization phase 420, the fast-ramp phase 430, and the cool-down phase 440. During the slow-ramp phase, the substrate is heated slowly and uniformly using open-loop heating to an initial temperature of about 500–600° C. The slow-ramp phase typically takes about 10 seconds. Then the substrate is stabilized at the initial temperature during the stabilization phase 420 for less than about 5 seconds. Subsequently, during the fast ramp-up phase 430, the substrate is heated again using closed-loop heating so that the substrate temperature rises at a rate of about 50–400° C. per second to a peak temperature of about 1000–1100° C. The substrate may be soaked at the peak temperature for a short period of time (~0–1 second), and is then cooled down during the cool-down phase 440 so that the substrate temperature drops at a rate of about 50–400° C. per second. At the end of thermal process 350, substrate 12 is unloaded at step 380 from processing chamber 14 and another substrate is loaded at step 330 into processing chamber 14 (if more substrates are to be processed).

During or shortly before the thermal process step 350, with the flow of the carrier gas continuing, oxygen is introduced at step 360 into processing chamber 14 at a pre-calibrated flow rate through MFC 80. The pre-calibrated oxygen flow rate may depend on the gas pressure in processing chamber 14, the flow rate of the carrier gas, and a predetermined oxygen concentration for the anneal ambient, as discussed above. The desired oxygen concentration for the anneal ambient depends on the type of dopants used, and the performance requirements of the devices being fabricated. In one embodiment of the present invention, the desired oxygen concentration in processing chamber 14 is in the range of 1500 to about 75,000 ppm, and more typically in the range of 10,000 to about 25,000 ppm. After oxygen is introduced into processing chamber 14, the flow rate of oxygen (or the MFC 80) is periodically adjusted by controller 99 based on readings from oxygen sensor 95 so that the predetermined oxygen concentration value is maintained in processing chamber when oxygen in processing chamber is desired. By maintaining the gas pressure in processing chamber 14 at or below 100 Torr, the time it takes for the second feedback loop to adjust the oxygen concentration to the desired value, after a sufficient drift from that value is detected, should be less than a second. This allows accurate and dynamic control of the ambient gas composition during thermal process step 350. The oxygen flow may be turned off at step 370 before the substrate is unloaded at step 380 from processing chamber 14, so as to prevent the oxygen from leaking into the transfer chamber(s).

Also, with the fast response provided by the low chamber gas pressure, oxygen in chamber 14 can be introduced into processing chamber 14 during a processing phase when a certain level of oxygen concentration in the annealing ambient is desired and can be turned off or down during a processing phase when oxygen is not desired. In one embodiment of the present invention, oxygen is introduced into processing chamber 14 throughout thermal process step 350. In an alternative embodiment of the present invention, oxygen is introduced into processing chamber 14 only during certain phases of the thermal process step 350. For example, oxygen may be introduced at step 360 into processing chamber near the time when the fast-ramp phase 430 starts and during the soak time (if there is any) in thermal process step 350. Near the time when the substrate starts to cool down, the oxygen flow may be terminated at step 370 either by turning off the MFC 80 or by changing the $O_2$ set point to zero, allowing the oxygen concentration in the chamber to drop. At sufficiently low pressure, such as 5–20 Torr, the oxygen concentration may drop below the predetermined minimum value before the end of the thermal process step 350. Considering also that oxygen is not introduced during the slow-ramp phase 410 and the stabilization phase 420 so that chamber 14 is further purged of oxygen during these phases, purging step 310 may be shortened or eliminated for the next substrate.

The exact order of some of the steps in the process 300 and/or the operation of the processing chamber 14 as described above can be altered. In addition, steps may be added or omitted and process parameters varied depending upon the requirements of a particular processing application and the particular RTP system in which the annealing process takes place. The above operations and the order in which they are presented are chosen for illustrative purposes and to provide a picture of a complete run sequence.

What is claimed is:

1. A method for activating implanted dopants in a semiconductor substrate in a processing chamber to form shallow junctions, the method comprising:

providing a flow of a carrier gas into the processing chamber while maintaining gas pressure in the processing chamber at a level lower than about 300 Torr;

subjecting the substrate to a thermal process; and during the thermal process, introducing oxygen into the processing chamber such that the oxygen concentration in the processing chamber reaches a level within a range of 1500–75000 ppm.

2. The method of claim 1 wherein the thermal process comprises a plurality of phases and oxygen is introduced into the processing chamber during part of the plurality of phases.

3. The method of claim 2 wherein the plurality of phases include a slow-ramp phase, a stabilization phase, a fast-ramp phase and a cool-down phase, and oxygen is introduced into the processing chamber near the start of the fast-ramp phase.

4. The method of claim 1 wherein the oxygen concentration in the processing chamber during the thermal process is stabilized at a level within a range of 10000–25000 ppm after oxygen is introduced into the processing chamber.

5. The method of claim 1 wherein the gas pressure in the chamber is in the range of 5–100 Torr.

6. The method of claim 1 wherein the gas pressure is maintained by a pressure control system.

7. The method of claim 6 wherein the pressure control system comprises:

a pressure control valve at a gas output of the processing chamber, the pressure control valve capable of being adjusted to control the rate at which gas is pumped out of the processing chamber;

a pressure gauge configured to measure the gas pressure in the processing chamber; and a programmable logic controller configured to adjust the pressure control valve based on the pressure measurement from the pressure gauge and a predetermined pressure set point.

8. The method of claim 7 wherein the programmable logic controller implements a proportional integral derivative algorithm to adjust the pressure control valve.

9. The method of claim 1 wherein the oxygen is introduced into the processing chamber at a volumetric flow rate that is controlled by a fluid control system.

10. The method of claim 9 wherein the fluid control system comprises:

a mass flow controller configured to introduce oxygen into the processing chamber at an adjustable volumetric flow rate;

an oxygen sensor coupled to the processing chamber and configured to monitor the oxygen concentration in the processing chamber; and a programmable logic controller coupled between the oxygen sensor and mass flow controller, and configured to adjust the MFC based on an oxygen concentration set point and the oxygen concentration value detected by the oxygen sensor.

11. The method of claim 1 wherein the implanted dopants comprise boron or arsenic.

12. A thermal process for annealing a semiconductor substrate in a processing chamber, comprising:

providing a flow of a carrier gas into the processing chamber while heating the substrate to an initial temperature; and after the substrate reaches the initial temperature, introducing oxygen into the processing chamber while heating the substrate from the initial temperature to a peak temperature;

wherein oxygen is introduced into the processing chamber such that the oxygen concentration in the processing chamber reaches a level in the range of 1500–75000 ppm before the substrate reaches the peak temperature; and wherein a gas pressure in the processing chamber is maintained at a level less than about 300 Torr during the thermal process.

13. The method of claim 12, further comprising terminating the introduction of oxygen into the processing chamber at or near the time when the substrate reaches the peak temperature.

14. The method of claim 12 wherein oxygen is introduced into the processing chamber such that the oxygen concentration in the chamber reaches a level in the range of 10000–15000 ppm before the substrate reaches the peak temperature.

15. The method of claim 12 wherein the gas pressure in the chamber is in the range of 5–20 Torr.

16. The method of claim 12 wherein the gas pressure is maintained by a pressure control system.

17. The method of claim 16 wherein the pressure control system comprises:

a pressure control valve at a gas output of the processing chamber, the pressure control valve capable of being adjusted to control the rate at which gas is pumped out of the processing chamber;

a pressure gauge configured to measure the gas pressure in the processing chamber; and a programmable logic controller configured to adjust the pressure control valve based on the pressure measurement from the pressure gauge and a predetermined pressure set point.

18. The method of claim 12 wherein oxygen is introduced into the processing chamber at a volumetric flow rate controlled by a fluid control system.

19. The method of claim 18 wherein the fluid control system comprises:

a mass flow controller configured to introduce oxygen into the processing chamber at an adjustable volumetric flow rate;

an oxygen sensor coupled to the processing chamber and configured to monitor the oxygen concentration in the processing chamber; and a programmable logic controller coupled between the oxygen sensor and mass flow controller, and configured to adjust the MFC based on an oxygen concentration set point and the oxygen concentration value detected by the oxygen sensor.

20. The method of claim 12 wherein the substrate has been implanted with boron or arsenic.

* * * * *